United States Patent [19]

Garbarini

[11] 3,992,235

[45] Nov. 16, 1976

[54] ETCHING OF THIN LAYERS OF REACTIVE METALS

[75] Inventor: Victor Charles Garbarini, Bethlehem, Pa.

[73] Assignee: Bell Telephone Laboratories, Incorporated, Murray Hill, N.J.

[22] Filed: May 21, 1975

[21] Appl. No.: 579,313

[52] U.S. Cl. .................................. 156/13; 156/18; 252/79.3; 252/79.4
[51] Int. Cl.² ........................................ H01L 21/441
[58] Field of Search .................. 156/7, 8, 18, 13; 252/793, 794

[56] References Cited
UNITED STATES PATENTS

| | | | |
|---|---|---|---|
| 2,974,021 | 3/1961 | Borowik | 252/79.3 |
| 3,657,029 | 4/1972 | Fuller | 156/18 |
| 3,860,464 | 1/1975 | Erdman et al. | 252/79.3 |
| 3,890,177 | 6/1975 | Pfahnl et al. | 156/18 |

*Primary Examiner*—William A. Powell
*Assistant Examiner*—Jerome W. Massie
*Attorney, Agent, or Firm*—Allen N. Friedman

[57] ABSTRACT

Thin films of reactive metals in contact with layers of more noble metals, are etched by an etchant including a reactive cathodic inhibitor. The etchant is a hydrofluoric acid-based composition with hydrogen peroxide, a water soluble tetrazolium compound (the inhibitor) and a surface modifier, such as an alcohol or a more complex surfactant. For exemplary compositions, the undercutting of masking layers of noble metals or photolithographic materials is limited to the same order as the reactive metal film thickness.

6 Claims, 2 Drawing Figures

ETCHING OF THIN LAYERS OF REACTIVE METALS

BACKGROUND OF THE INVENTION

1. Field of the Invention

The invention is in the field of the patterning of thin metal layers primarily for use in the production of solid state electronic devices.

2. Brief Description of the Prior Art

The production of both discrete and integrated solid state circuit devices often involves the etching of thin films of reactive metals in contact with more noble metals. For example, a common metallic contact to a silicon device consists of superposed layers of titanium, platinum or palladium and gold. When such layers are etched to define their ultimate shape, a common problem is accelerated attack of the reactive metal layer (titanium), near the point of contact with the more noble metal. This undercutting of overlying layers is usually enhanced by the existance of an electrolytic couple at the contact. This has typically required close monitoring of etching and removal of the etched devices immediately after etching is complete. It is also one factor which tends to place a minimum size limit or realizable conductor patterns.

In a related area of device processing, it is sometimes necessary to etch masked oxide layers on devices which already possess multilayer metallic contacts as described above. An etchant (U.S. Pat. No. 3,860,464, issued Jan. 14, 1975) developed to preferentially etch oxide layers while leaving reactive metal layers relatively undisturbed, involves the use of a tetrazolium salt as a reactive cathodic inhibitor and buffered HF as the etching agent.

SUMMARY OF THE INVENTION

An etching procedure has been found, using a tetrazolium inhibited etchant, for the etching of thin films of reactive metals in contact with more noble metals. The etchant is similar to an etchant previously developed for etching oxides while inhibiting the etching of reactive metals. The etchant includes hydrofluoric acid for rapid dissolution of the metal (as contrasted with the buffered HF of the oxide etchant). The inhibitor is a water soluble tetrazolium salt preferably triphenyl tetrazolium chloride, which reacts at cathodically (negatively) biased sites to produce a relatively insoluble formazan compound. The formazan deposits and forms an inhibiting barrier on the noble metal, near the reactive metal-noble metal interface, thus inhibiting the electrochemical attack. Hydrogen peroxide is included, primarily, to reduce hydrogen bubble formation during etching. This procedure greatly reduces the horizontal attack on the reactive metal layers, which otherwise produces undercutting of the overlying noble metal or polymeric (e.g., photoresist) layers. A surface modifier, such as an alcohol or a more complex surfactant, is included to facilitate wetting of the layer and subsequent removal of the formazan produced during etching. When polymeric layers are present, the use of an alcohol is particularly advantageous.

DETAILED DESCRIPTION OF THE INVENTION

Figure 1:
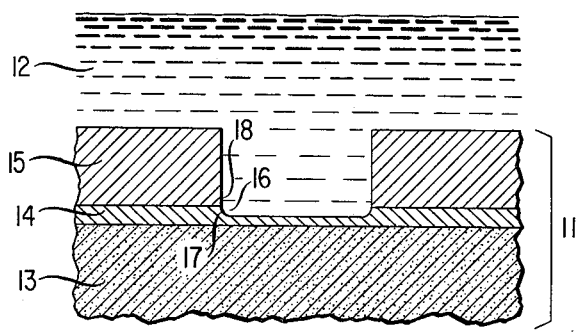
FIG. 1 is an elevational view in section of a semiconductor device being etched, the device having a reactive metal layer masked by an apertured noble metal layer.

A common problem met in the processing of multilayer semiconductor and other integrated circuit devices, is undercutting during etching steps. This is caused by preferential horizontal attack by the etchant of one layer, which is beneath an overlying layer. In situations in which a reactive metal layer is in contact with a layer of a more noble metal, this preferential horizontal attack is produced or enhanced by the existance of an electrolytic couple at the exposed edge of contact between the reactive and noble metals. In this couple, the noble metal becomes cathodically biased as reactive metal is removed by the etchant. The procedure disclosed here uses an etchant with a reactive cathodic inhibitor which reacts at the cathodic sites and deposits an insoluble or slowly soluble compound. This deposition tends to block electrolytically enhanced corrosion of the reactive metal layer, particularly in the sheltered areas immediately adjacent to the noble metal contact.

The Etchant

The etchant used in the herein disclosed process is an aqueous solution, which includes hydrofluoric acid (HF) to the extent of approximately 0.5 to 5 weight percent. The etch rate on titanium or similar HF soluble metals generaly increases with increasing hydrofluoric acid concentration. Below this range, etch rates are too slow, while above this range the etchant may attack silicon dioxide layers or similar layers formed on the semiconductor for passivation.

Hydrogen peroxide is included to the extent of approximately 1 to 5 weight percent, in an amount sufficient to suppress hydrogen formation on the surfaces being etched. It is considered that the hydrogen peroxide also serves as a complexing agent to promote the solution of metal salts produced during etching. This faciltates the diffusion of these salts from the etching site during etching and their removal during subsequent washing operations. Lower concentrations are generally ineffective while higher concentrations tend to reduce the controllability of the etchant.

The inhibitor, included to suppress undercutting (accelerated horizontal attack of the reactive metal layer) is a water soluble tetrazolium compound, preferably triphenyl tetrazolium chloride. The unsubstituted tetrazolium radical has the formula:

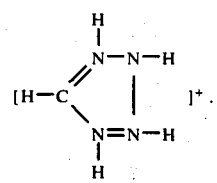

It may be singly or multiply substituted to produce the contemplated water soluble tetrazolium compounds. Triphenyl tetrazolium chloride has the formula:

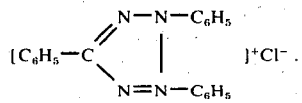

It is considered that these compounds act as reactive cathodic inhibitors, being converted from soluble ionic form to a less soluble formazan compound at the cathodic site of an electrolytic couple. The formazan deposits at the cathodic site and forms a protective layer, suppressing the enhanced electrochemical attack of the adjacent metal. When a reactive metal, such as Ti, Ta, Nb, Hf or Zr is in contact with a more noble metal such as Pt, Pd or Au, the noble metal becomes cathodic when the two are contacted by an electrolyte. The tetrazolium compound is included to the extent of approximately 0.01 to 0.1 weight percent, based on the entire etchant. The higher end of this composition range usually corresponds to slower etch rates. Concentrations lower than this range offer inadequate protection, while concentrations higher than this range tend to produce inordinately slow etch rates.

The etchant employed also includes a nonpolar nonionic surface modifier, which aids the process in several ways. It aids, for example, by improving the wetting of the device precursor being etched and by aiding in the removal of the reaction products. One class of surface modifiers are the alcohols with two to ten carbons (methanol is too polar). In the recommended concentration range the alcohol increases the solubility of the produced formazan in the etchant. The formazan is then removed from the open areas being etched, while tending to remain in the sheltered areas being protected. At less than 10 volume percent, the alcohol is less than optimally effective. At more than 50 volume percent, the alcohol inordinately reduces the etch rate. The use of an alcohol as the surface modifier is particularly advantageous when polymer (e.g., photoresist) masking layers are present. It reduces the lifting of such photoresist masks.

More complex surfactants can also be used as the surface modifier constitutent. For example, a water soluble isooctyl polyethoxy ethanol (available commercially as TRITON X-100, trademark of Rohm and Haas Company) can be used in the concentration range of approximately 0.02 to 0.05 weight percent. Such surfactants also aid in the removal of the relatively insoluble formazan in subsequent rinsing steps. Lower concentrations are less than adequately effective and higher concentrations may interfere with the reactions.

The Process

Figure 2:
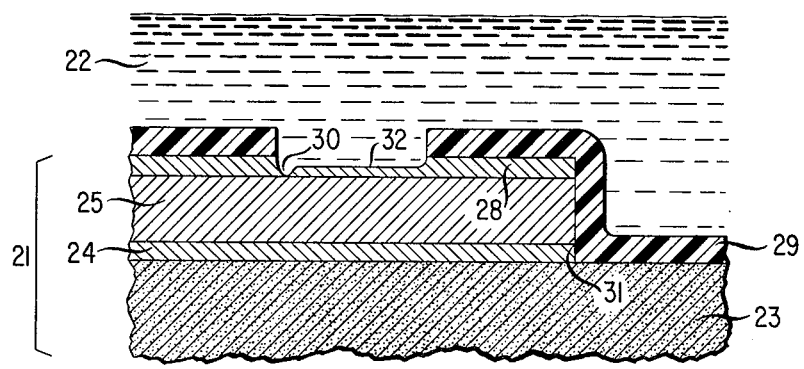
FIG. 2 is an elevational view in section of a semiconductor device being etched, the device having a reactive metal layer over a noble metal layer and masked by an apertured polymer layer.

The contemplated etching procedure is illustrated in FIGS. 1 and 2, where the device precursor 11, 21 (the unfinished device in early stages of processing) is in contact with the etchant 12, 22. The device precursor includes a substrate 13, 23 which may be an insulator or a semiconductor material. In FIG. 1 the substrate bears a layer 14 of a reactive metal such as titanium, tantalum, niobium, hafnium or zirconium (HF soluble metals) and an apertured layer 15 of a more noble metal such as platinum, palladium or gold. This layer 15 serves as an etch mask for the reactive metal layer 14. With prior art etchants the electrolytic couple or corrosion cell produced at the contact 16 between the two layers produces accelerated attack of the reactive metal layer 14 at that point 16. This produces horizontal attack of the reactive metal 14 and undercutting of the noble metal layer 15. In the present etching procedure the reactive cathodic inhibitor reacts and deposits an insoluble or poorly soluble compound on the cathodic site 18 of the electrolytic couple 16. This deposition inhibits the electrolytic action of the corrosion cell and greatly reduces the undercutting of the noble metal layer 15.

In FIG. 2 the substrate 23 bears a reactive metal layer 24, a noble metal layer 25 and a second reactive metal layer 28. The upper surface of the device precursor 21 is covered with an apertured layer 29 of a polymeric material, typically, of a class of materials known as photoresists. This apertured polymeric layer 29 serves as an etch mask for the upper reactive metal layer 28. When such a polymer layer 29 is employed, the use of an alcohol as the surface modifying ingredient of the etchant is preferred because this formulation produces less lifting of the photoresist than alternate formulations. The device precursor 21 is susceptible to accelerated electrolytic attack if, for example, there is etch breakthrough of one portion 30 of the upper reactive metal layer 28 or if there is a pinhole in the polymer layer 29 which exposes the lower junction 31 to the electrolyte. In such cases the reaction of the inhibitor on the cathodic site greatly reduces any horizontal attack which would otherwise have taken place. Some deposition of the inhibitor reaction product does take place on the open areas 32 of the reactive metal layer 28. However, with an alcohol containing formulation these reaction products are sufficiently soluble in the etchant 22 to be removed from these opened areas 32 while still producing sufficiently inhibiting action in the sheltered areas 30, 31.

When the preferred inhibitor, triphenyl tetrazolium chloride or similar dye former is used, the deposited formazan is colored. The etching can, then, be visually monitored and the device precursors 21 removed from the etchant 22 when all traces of color have disappeared from open areas 32. This etching process also has the advantage of "room temperature" operation.

EXAMPLES

An exemplary etchant formulation in a preferred composition range is made by mixing together the following ingredients:
1. 1 milliliter of a 50 weight percent aqueous solution of HF (hydrofluoric acid) (or 16 ml of a 15:1 dilution);
2. 5 milliliters of a 30 weight percent solution of $H_2O_2$ (hydrogen peroxide);
3. 2.5 milliliters of a 2 weight percent aqueous solution of triphenyl tetrazolium chloride;
4. either (a) 50 milliliters of isopropanol or b) 50 milliliters of a 0.05 weight percent aqueous solution of TRITON X-100; and
5. enough water to make 100 milliliters of etchant solution.

The resulting solution is approximately 0.3M in HF, 0.5M in $H_2O_2$ and $2 \times 10^{-3}$ M in triphenyl tetrazolium chloride. When used at room temperature, this formulation removes approximately 1500 Angstroms of titanium per minute with negligible undercutting, even when overetched several hundred percent. This procedure was used to etch titanium layers approximately one quarter micrometers thick on silicon wafers, masked by gold-on-palladium stripes 8 micrometers wide. Undercutting of the noble metal stripes was less than one micrometer, even when the devices were left in the etchant four times as long as was necessary to remove the exposed titanium.

What is claimed is:

1. Method for the etching of a reactive metal layer comprising contacting a device precursor with an etchant wherein the device precursor includes a substrate, at least one partially exposed reactive metal layer and at least one noble metal layer in contact with the reactive metal layer, characterized in that the etchant is an aqueous solution consisting of 0.5 to 5 weight percent HF, 1 to 5 weight percent $H_2O_2$, 0.01 to 0.1 weight percent of a water soluble tetrazolium compound and a surface modifier, in which the etchant contains from 10 to 50 percent by volume of an alcohol, containing at least two carbons, as the surface modifier, whereby the exposed reactive metal is removed without excessive horizontal attack.

2. A method of claim 1 in which at least one of the reactive metal layers is situated between the substrate and the noble metal layer and in which the noble metal layer is so disposed as to leave a portion of the reactive metal layer exposed to the contacting etchant.

3. A method of claim 1 in which at least one of the reactive metal layers is situated above the noble metal layer, relative to the substrate, and is partially covered by a polymeric protective layer.

4. A method of claim 1 in which the alcohol is isopropanol.

5. A method of claim 1 in which the reactive metal is titanium.

6. A method of claim 1 in which the tetrazolium compound is triphenyl tetrazolium chloride.

* * * * *